(12) United States Patent
Tunks et al.

(10) Patent No.: US 11,812,580 B2
(45) Date of Patent: Nov. 7, 2023

(54) MODULAR BREAKOUT CABLE

(71) Applicant: Dell Products L.P., Round Rock, TX (US)

(72) Inventors: Eric Michael Tunks, Austin, TX (US); Travis Christopher West-Edwards, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 95 days.

(21) Appl. No.: 17/450,568

(22) Filed: Oct. 12, 2021

(65) Prior Publication Data
US 2023/0116864 A1    Apr. 13, 2023

(51) Int. Cl.
*G02B 6/44* (2006.01)
*G02B 6/00* (2006.01)
*H05K 7/14* (2006.01)

(52) U.S. Cl.
CPC ......... *H05K 7/1491* (2013.01); *G02B 6/4472* (2013.01)

(58) Field of Classification Search
CPC ................................. G02B 6/44; G02B 6/00
USPC .......................................................... 385/135
See application file for complete search history.

(56) References Cited

U.S. PATENT DOCUMENTS

| | | | | |
|---|---|---|---|---|
| 8,750,393 B1 * | 6/2014 | Alshinnawi | ......... | H05K 7/1492 375/257 |
| 2002/0004915 A1 * | 1/2002 | Fung | ..................... | G06F 1/3221 713/320 |
| 2002/0062454 A1 * | 5/2002 | Fung | ..................... | G06F 3/0689 713/300 |
| 2002/0080575 A1 * | 6/2002 | Nam | .................. | H05K 7/20727 361/679.48 |
| 2003/0033463 A1 * | 2/2003 | Garnett | ................ | G11B 33/128 361/679.31 |

(Continued)

FOREIGN PATENT DOCUMENTS

CA    2953802 A1 *   8/2010   ........... H01R 13/665

OTHER PUBLICATIONS

Moscalu, Lorena. "Damaged always worse than a completely broken fiber optic cable", https://peakoptical.com/2019/02/damaged-worse-than-broken/, Feb. 6, 2019.

(Continued)

*Primary Examiner* — Kaveh C Kianni
(74) *Attorney, Agent, or Firm* — McDermott Will & Emery LLP

(57) ABSTRACT

A breakout cable, including a first portion of the cable coupled to a network switch, wherein at least a first section of the first portion is located within a volume inside of side walls of the computing rack, the first section of the first portion including first and second connectors and extending in a first direction; a second portion of the cable including a third connector, the third connector coupled to the first connector of the first portion and the first network interface module connected to a first server, the second portion of the cable extending in a second direction transverse to the first direction; a third portion of the cable including a fourth connector and, the fourth connector coupled to the second connector of the first portion and the second network interface module connected to a second server, the third portion of the cable extending in the second direction.

5 Claims, 4 Drawing Sheets

(56) References Cited

U.S. PATENT DOCUMENTS

| | | | | |
|---|---|---|---|---|
| 2003/0196126 | A1* | 10/2003 | Fung | G06F 1/3203 713/300 |
| 2003/0204611 | A1* | 10/2003 | McCosh | H04L 43/50 709/230 |
| 2005/0102549 | A1* | 5/2005 | Davies | H04L 67/1097 714/4.1 |
| 2009/0327782 | A1* | 12/2009 | Ballou | H04L 12/10 713/300 |
| 2012/0109912 | A1* | 5/2012 | Donze | H04L 41/12 707/694 |
| 2013/0234725 | A1* | 9/2013 | Enge | G01R 31/66 324/538 |
| 2014/0173156 | A1* | 6/2014 | Alshinnawi | G06F 13/36 710/305 |
| 2014/0181564 | A1* | 6/2014 | Alshinnawi | H05K 7/1492 713/340 |
| 2015/0229529 | A1* | 8/2015 | Engebretsen | H04L 41/0893 709/223 |
| 2016/0073542 | A1* | 3/2016 | Huang | H05K 7/1492 361/781 |
| 2017/0257970 | A1* | 9/2017 | Alleman | G06F 1/20 |
| 2017/0329623 | A1* | 11/2017 | Dong | G06T 1/20 |
| 2021/0076529 | A1* | 3/2021 | Pachoud | H04L 41/24 |
| 2021/0345024 | A1* | 11/2021 | Leigh | H04J 14/0212 |
| 2023/0043794 | A1* | 2/2023 | Winzer | G02B 6/4261 |

OTHER PUBLICATIONS

Breakout or Distribution Cables—Which One to Choose?, https://www.fiber-optical-networking.com/breakout-distribution-cables-one-choose.html, Jan. 5, 2017.

1m (3ft) Dell (DE) AOC-Q28-4SFP28-25G-IM Compatible 100G QSFP28 to 4×25G SFP28 Breakout Active Optical Cable, https://www.fs.com/products/70504.html?attribute=1762&id=197359, Jan. 18, 2022.

SFP vs SFP+ vs SFP28 vs QSFP+ vs QSFP28, What Are the Differences?, https://community.fs.com/blog/sfp-vs-sfp-vs-sf-p28-vs-qsfp-vs-qsf-p28-what-are-the-differences.html, Jan. 5, 2022.

* cited by examiner

MODULAR BREAKOUT CABLE

BACKGROUND

Field of the Disclosure

The disclosure relates generally to a modular breakout cable for use in computing racks.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

When fiber optic infrastructures are installed or moved, fiber cables can become bent, deformed, broken, or cracked, resulting in signal distortion and faults, and ultimately cable replacement. Furthermore, replacing such cables can cause multiple servers to be disconnected and brought offline until a new cable is installed.

SUMMARY

Innovative aspects of the subject matter described in this specification may be embodied in a breakout cable for use in a computing rack, including: a first portion of the cable coupled to a network switch, the first portion of the cable physically located within the computing rack, wherein at least a first section of the first portion of the cable is located within a volume inside of side walls of the computing rack, the first section of the first portion of the cable including first and second connectors and extending in a first direction; a second portion of the cable physically located within the computing rack, the second portion of the cable including a third connector and a first network interface module, the third connector coupled to the first connector of the first portion of the cable and the first network interface module connected to a first server of the computing rack, the second portion of the cable extending in a second direction transverse to the first direction; a third portion of the cable physically located within the computing rack, the third portion of the cable including a fourth connector and a second network interface module, the fourth connector coupled to the second connector of the first portion of the cable and the second network interface module connected to a second server of the computing rack, the third portion of the cable extending in the second direction; wherein the second portion and the third portion of the cable are independently removable i) to retain connectivity between the switch and the second server when the second portion of the cable is removed and ii) retain connectivity between the switch and the first server when the third portion of the cable is removed.

Other embodiments of these aspects include corresponding systems and apparatus.

These and other embodiments may each optionally include one or more of the following features. For instance, the second direction extends along a width of the computing rack transverse to the side walls of the computing rack. The first portion further includes a second section and a third section of the cable that are located between the network switch and the first section of the cable, the second section and the third section of the first portion of the cable extending in the second direction. The first section of the first portion of the cable further includes a fifth adapter positioned at a first end of the first section of the first portion of the cable, the first adapter of the first section of the first portion of the cable positioned at a second end opposite to the first end, wherein the second section of the first portion of the cable further includes a sixth adapter coupled to the fifth adapter of the first section of the first portion of the cable. The first section of the first portion of the cable further includes a seventh adapter positioned at the first end of the first section of the first portion of the cable, the second adapter of the first section of the first portion of the cable positioned at the second end opposite to the first end, wherein the third section of the first portion of the cable further includes an eight adapter coupled to the seventh adapter of the first section of the first portion of the cable. The second section of the first portion of the cable and the third section of the first portion of the cable are independently removable i) to retain connectivity between the switch and the first server when the second section of the first portion of the cable is removed and ii) retain connectivity between the switch and the second server when the third section of the first portion of the cable is removed. The volume inside of the side walls of the computing rack is the zero U space of the computing rack.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

Figure 1:
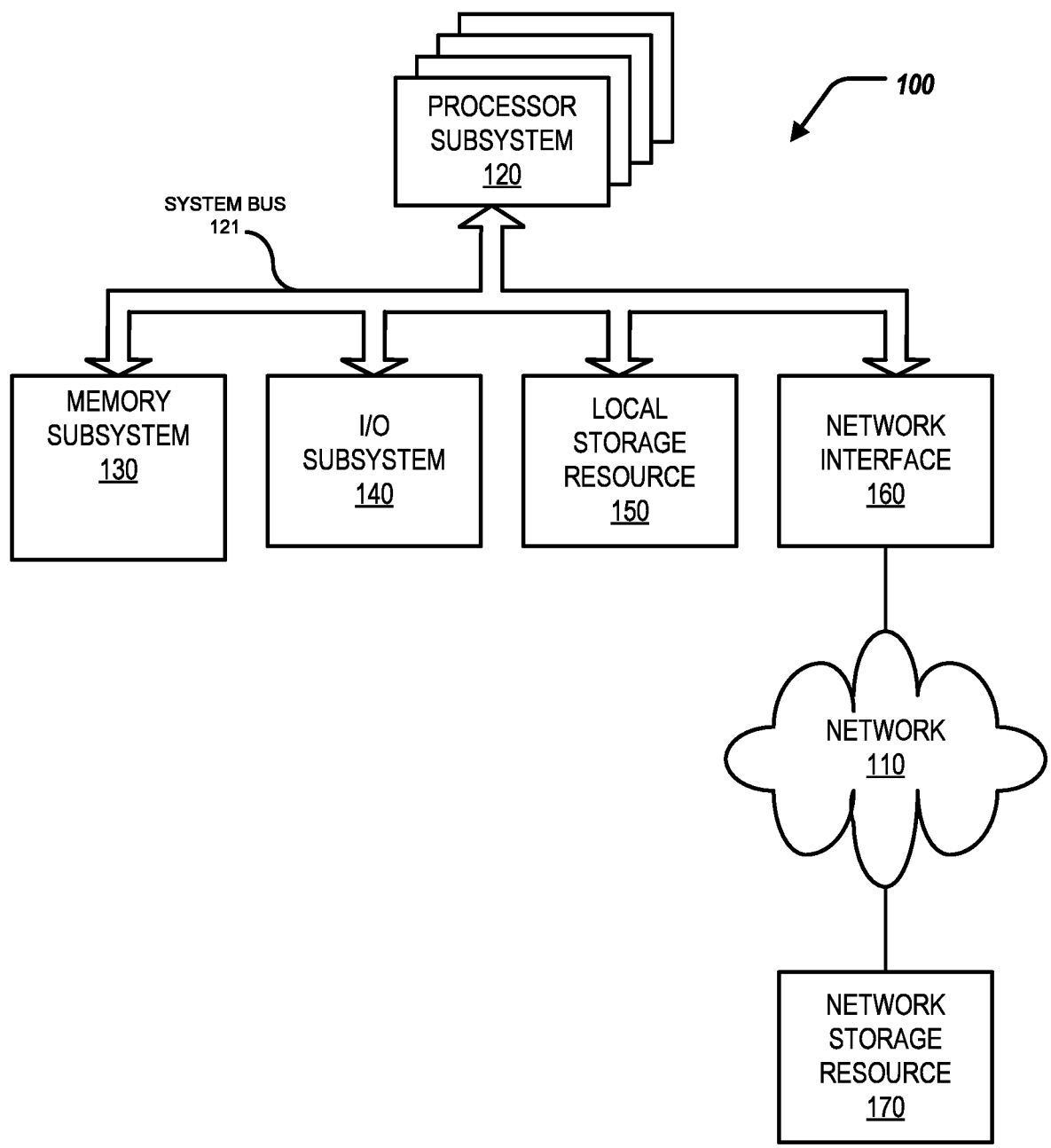
FIG. 1 is a block diagram of selected elements of an embodiment of an information handling system.

This disclosure discusses a modular breakout cable for use in a computing rack. In short, a modular breakout cable can interconnect on each side of various lengths of an optical cable. When the optical cable is damaged, only the modular portion of the breakout cable needs to be replaced. Thus, only the single affected server connected to the replaced modular portion of the breakout cable is taken offline, while remaining servers are maintained online.

Specifically, this disclosure discusses a breakout cable for use in a computing rack, including: a first portion of the cable coupled to a network switch, the first portion of the cable physically located within the computing rack, wherein at least a first section of the first portion of the cable is located within a volume inside of side walls of the computing rack, the first section of the first portion of the cable including first and second connectors and extending in a first direction; a second portion of the cable physically located within the computing rack, the second portion of the cable including a third connector and a first network interface module, the third connector coupled to the first connector of the first portion of the cable and the first network interface module connected to a first server of the computing rack, the second portion of the cable extending in a second direction transverse to the first direction; a third portion of the cable physically located within the computing rack, the third portion of the cable including a fourth connector and a second network interface module, the fourth connector coupled to the second connector of the first portion of the cable and the second network interface module connected to a second server of the computing rack, the third portion of the cable extending in the second direction; wherein the second portion and the third portion of the cable are independently removable i) to retain connectivity between the switch and the second server when the second portion of the cable is removed and ii) retain connectivity between the switch and the first server when the third portion of the cable is removed.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-4 wherein like numbers are used to indicate like and corresponding parts.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

In short, a modular breakout cable can interconnect on each side of various lengths of an optical cable. When the optical cable is damaged, only the modular portion of the breakout cable needs to be replaced. Thus, only the single affected server connected to the replaced modular portion of the breakout cable is taken offline, while remaining servers are maintained online.

Figure 2:
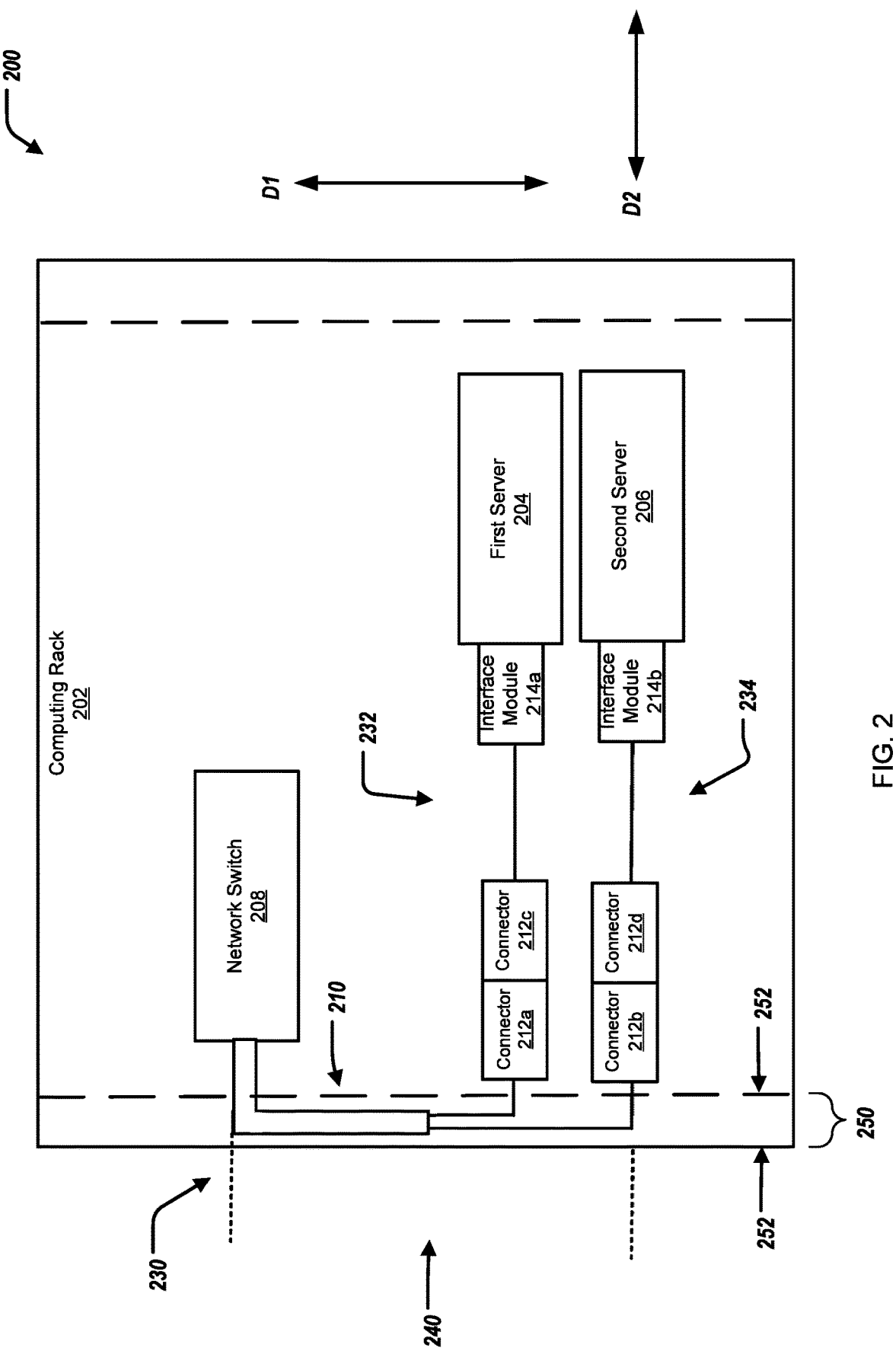
FIGS. 2-4 illustrate respective block diagrams of a computing rack including a breakout cable, in differing embodiments.

Turning to FIG. 2, FIG. 2 illustrates an environment 200 including a computing rack 202. The computing rack 202 can include a first server 204, a second server 206, a network switch 208, a breakout cable 210, connectors 212a, 212b, 212c, 212d (collectively referred to as connectors 212), and network interface modules 214a, 214b (collectively referred to as network interface modules 214). In some examples, the first server 204 and/or the second server 206 is similar to, or includes, the information handling system 100 of FIG. 1.

The breakout cable 210 can include a first portion 230, a second portion 232, and a third portion 234. The first portion 230 of the cable 210 is coupled to the network switch 208. In some examples, the first portion 230 of the cable 210 is coupled to a transceiver (not shown) that is coupled to the network switch 208. The first portion 230 of the cable 210 can be physically located within the computing rack 202. The first portion 230 of the cable 210 can include a first section 240. The first section 240 of the first portion 230 of the cable 210 is located within a volume 250 of sidewalls 252 of the computing rack 202. In some examples, the volume 250 inside of the sidewalls 252 of the computing rack 202 can be referred to as the zero U space of the computing rack 202. The first section 240 of the first portion 230 of the cable 210 can include the connector 212a and the connector 212b. The first section 240 of the first portion 230 of the cable 210 can extend in a first direction D1 ("north-south").

The second portion 232 of the cable 210 can be physically located within the computing rack 202. The second portion 232 of the cable 210 includes the connector 212c and the network interface module 214a. The connector 232c is coupled to (connected with, engaged with) the connector 212a of the first portion 230 of the cable 210. The network interface module 214a is coupled to (connected with, engaged with) the first server 204 of the computing rack 202. In some examples, the second portion 232 of the cable 210 extends in a second direction D2 ("east-west"). The second direction D2 is transverse to the first direction D1. That is, the second portion 232 of the cable 210 extends in the second direction D2 that is transverse to the direction D1 that the first section 240 of the first portion 230 of the cable 210 extends in.

In some examples, the second direction D2 extends along a width of the computing rack 202 transverse to the sidewalls 252 of the computing rack 202.

The third portion 234 of the cable 210 can be physically located within the computing rack 202. The third portion 234 of the cable 210 includes the connector 212d and the network interface module 214b. The connector 212d is coupled to (connected with, engaged with) the connector 212b of the first portion 230 of the cable 210. The network interface module 214b is coupled to (connected with, engaged with) the second server 206 of the computing rack 202. In some examples, the third portion 234 of the cable 210 extends in the second direction D2 ("east-west"). That is, the third portion 234 of the cable 210 extends in the second direction D2 that is transverse to the direction D1 that the first section 240 of the first portion 230 of the cable 210 extends in.

To that end, the second portion 232 of the cable 210 and the third portion 234 are independently removable. That is, when the second portion 232 of the cable 210 is removed (i.e., the connector 212c is disengaged from the connector 212a and the network interface module 214a is disengaged from the first server 204), connectively is retained between the network switch 208 and the second server 206 via the third portion 234 of the cable 210. Similarly, when the third portion 234 of the cable 210 is removed (i.e., the connector 212d is disengaged from the connector 212b and the network interface module 214b is disengaged from the second server 206), connectively is retained between the network switch 208 and the first server 204 via the second portion 232 of the cable 210.

Figure 3:
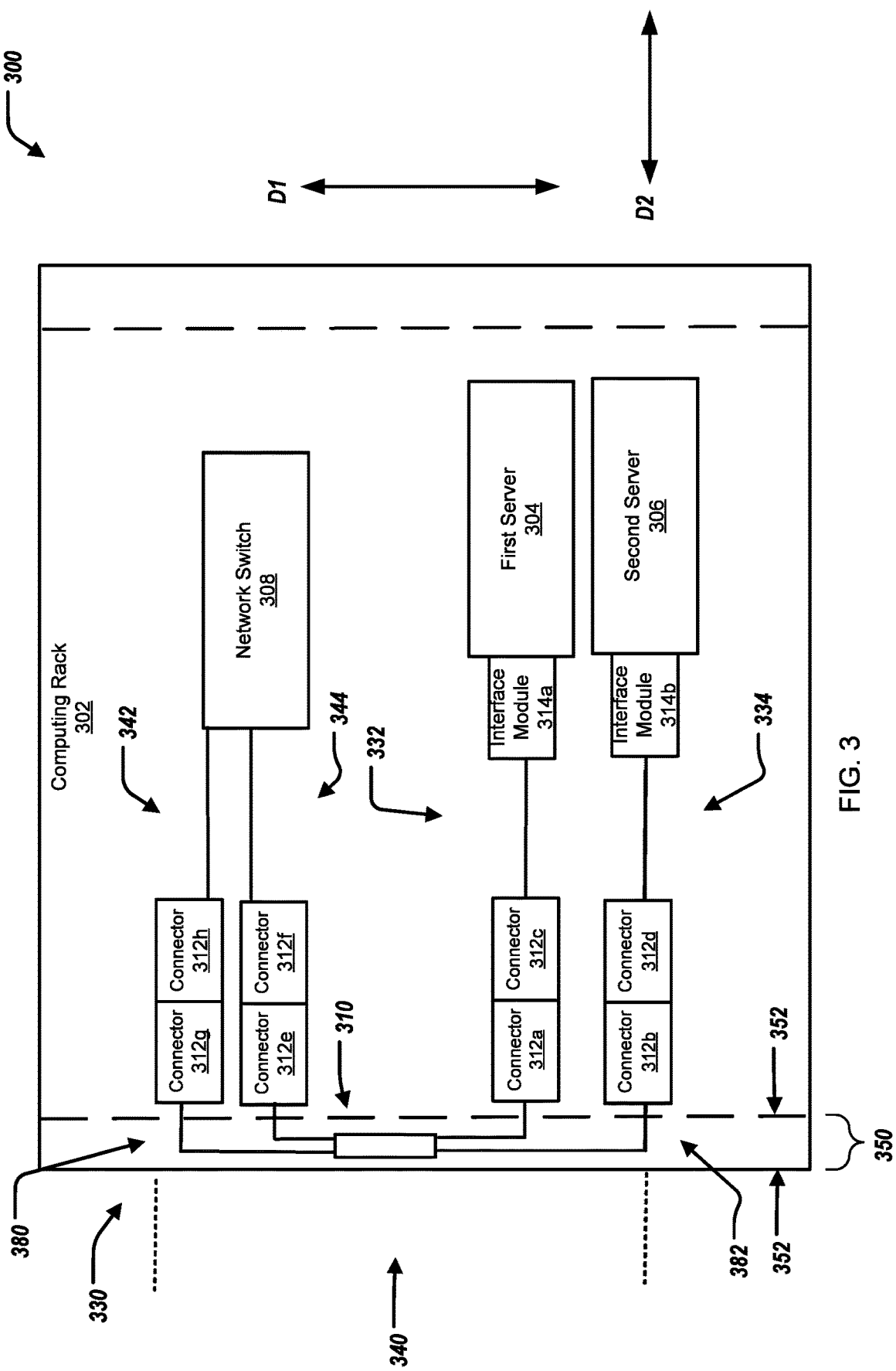

Turning to FIG. 3, FIG. 3 illustrates an environment 300 including a computing rack 302. The computing rack 302 can include a first server 304, a second server 306, a network switch 308, a breakout cable 310, connectors 312a, 312b, 312c, 312d, 312e, 312f, 312g, 312h (collectively referred to as connectors 312), and network interface modules 314a, 314b (collectively referred to as network interface modules 314). In some examples, the first server 304 and/or the second server 306 is similar to, or includes, the information handling system 100 of FIG. 1.

The breakout cable 310 can include a first portion 330, a second portion 332, and a third portion 334. The first portion 330 of the cable 310 is coupled to the network switch 308.

The first portion 330 of the cable 310 can be physically located within the computing rack 302. The first portion 330 of the cable 310 can include a first section 340, a second section 342, and a third section 344.

The first section 340 of the first portion 330 of the cable 310 is located within a volume 350 of sidewalls 352 of the computing rack 302. In some examples, the volume 350 inside of the sidewalls 352 of the computing rack 302 can be referred to as the zero U space of the computing rack 302. The first section 340 of the first portion 330 of the cable 310 can include the connector 312a and the connector 312b. The first section 340 of the first portion 330 of the cable 310 can extend in the first direction D1 ("north-south").

The first section 340 can additionally include the connector 312e and the connector 312g. The connectors 312e, 312g can be positioned at a first end 380 of the first section 340 of the first portion 330 of the cable 210. The connectors 312a and 312b of the first section 340 of the first portion 330 of the cable 210 can be positioned at a second end 382 of the first section 340 of the first portion 330 of the cable 210 opposite to the first end 380.

The second section 342 and the third section 344 of the first portion 330 of the cable 310 are located between the first section 340 of the cable 210 and the network switch 308. The second portion 342 and the third section 344 of the first portion 330 of the cable 310 are coupled to the network switch 308. In some examples, the second portion 342 and the third section 344 of the first portion 330 of the cable 310 are coupled to a transceiver (not shown) that is coupled to the network switch 308.

The second section 342 and the third section 344 of the first portion 330 of the cable 410 can extend in the second direction D2 ("east-west"). The second direction D2 is transverse to the first direction D1. That is, the second section 342 and the third section 344 of the first portion 330 of the cable 310 extend in the second direction D2 that is transverse to the direction D1 that the first section 340 of the first portion 330 of the cable 310 extends in.

The second section 342 of the first portion 330 of the cable 310 can further include the connector 312h. The connector 312h can be coupled to (connected with, engaged with) the connector 312g of the first portion 330 of the cable 310. The third section 344 of the first portion 330 of the cable 310 can further include the connector 312f. The connector 312f can be coupled to (connected with, engaged with) the connector 312e of the first portion 330 of the cable 310.

The second portion 332 of the cable 310 can be physically located within the computing rack 302. The second portion 332 of the cable 310 includes the connector 312c and the network interface module 314a. The connector 312c is coupled to (connected with, engaged with) the connector 312a of the first portion 330 of the cable 310. The network interface module 314a is coupled to (connected with, engaged with) the first server 304 of the computing rack 302. In some examples, the second portion 332 of the cable 310 extends in the second direction D2 ("east-west"). That is, the second portion 332 of the cable 310 extends in the second direction D2 that is transverse to the direction D1 that the first section 340 of the first portion 3230 of the cable 310 extends in.

In some examples, the second direction D2 extends along a width of the computing rack 302 transverse to the sidewalls 352 of the computing rack 302.

The third portion 334 of the cable 310 can be physically located within the computing rack 302. The third portion 334 of the cable 310 includes the connector 312d and the network interface module 314b. The connector 332d is coupled to (connected with, engaged with) the connector 312b of the first portion 330 of the cable 310. The network interface module 314b is coupled to (connected with, engaged with) the second server 306 of the computing rack 302. In some examples, the third portion 334 of the cable 310 extends in the second direction D2 ("east-west"). That is, the third portion 334 of the cable 310 extends in the second direction D2 that is transverse to the direction D1 that the first section 340 of the first portion 330 of the cable 310 extends in.

To that end, the second portion 332 of the cable 310 and the third portion 334 are independently removable. That is, when the second portion 332 of the cable 310 is removed (i.e., the connector 312c is disengaged from the connector 312a and the network interface module 314a is disengaged from the first server 304), connectively is retained between the network switch 308 and the second server 306 via the third portion 334 of the cable 310. Similarly, when the third portion 342 of the cable 310 is removed (i.e., the connector 312d is disengaged from the connector 312b and the network interface module 314b is disengaged from the second server 306), connectively is retained between the network switch 308 and the first server 304 via the second portion 332 of the cable 310.

Moreover, the second section 342 of the first portion 330 of the cable 310 and the third section 344 of the first portion 330 of the cable 310 are independently removable. That is, when the second section 342 of the first portion 330 of the cable 310 is removed (i.e., the connector 312h is disengaged from the connector 312g; and the second section 342 is disengaged from the network switch 308 (or transceiver)), connectively is retained between the network switch 308 and the second server 306 via the third section 344 of the first portion 330 of the cable 310 and the third portion 334 of the cable 210. Similarly, when the third section 344 of the first portion 330 of the cable 310 is removed (i.e., the connector 312f is disengaged from the connector 312e; and the third section 344 is disengaged from the network switch 308 (or transceiver)), connectively is retained between the network switch 308 and the first server 304 via the second section 342 of the first portion 330 of the cable 310 and the second portion 332 of the cable 310.

Figure 4:
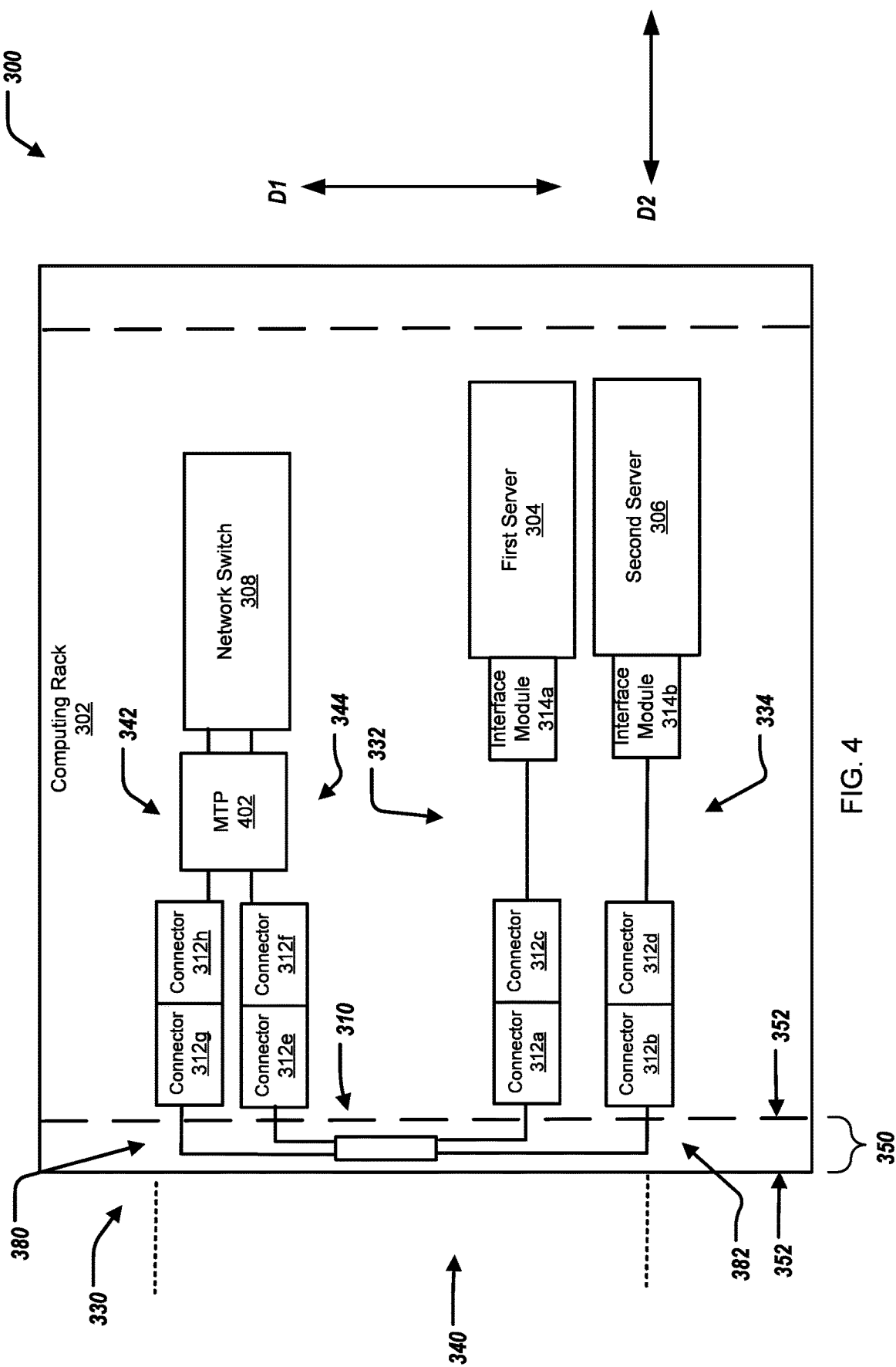

FIG. 4 illustrates the environment 300 in a further implementation. Specifically, the computing rack 302 can further include multi-fiber termination Push-on (MTP) connector 402. The MTP 402 can be positioned between the second section 342 of the first portion 330 of the cable 310/the third section 344 of the first portion 330 of the cable 310 and the network switch 308. That is, the MTP 402 can be connected to the connector 312h, the connector 312f, and the network switch 308. In some examples the MTP 402 is connected to a transceiver that is connected to the network switch 308.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A breakout cable for use in a computing rack, including:
a first portion of the cable coupled to a network switch, the first portion of the cable physically located within the computing rack, wherein at least a first section of the first portion of the cable is located within a volume inside of side walls of the computing rack, the first section of the first portion of the cable including first and second connectors and extending in a first direction, wherein the first portion further includes a second section and a third section of the cable that are located between the network switch and the first section of the cable, the second section and the third section of the first portion of the cable extending in a second direction transverse to the first direction;
a second portion of the cable physically located within the computing rack, the second portion of the cable including a third connector and a first network interface module, the third connector coupled to the first connector of the first portion of the cable and the first network interface module connected to a first server of the computing rack, the second portion of the cable extending in the second direction; and
a third portion of the cable physically located within the computing rack, the third portion of the cable including a fourth connector and a second network interface module, the fourth connector coupled to the second connector of the first portion of the cable and the second network interface module connected to a second server of the computing rack, the third portion of the cable extending in the second direction;
wherein the second portion and the third portion of the cable are independently removable i) to retain connectivity between the switch and the second server when the second portion of the cable is removed and ii) retain connectivity between the switch and the first server when the third portion of the cable is removed,
wherein the first section of the first portion of the cable further includes a fifth connector positioned at a first end of the first section of the first portion of the cable, the first connector of the first section of the first portion of the cable positioned at a second end opposite to the first end, wherein the second section of the first portion of the cable further includes a sixth connector coupled to the fifth connector of the first section of the first portion of the cable.

2. The breakout cable of claim 1, wherein the second direction extends along a width of the computing rack transverse to the side walls of the computing rack.

3. The breakout cable of claim 1, wherein the first section of the first portion of the cable further includes a seventh connector positioned at the first end of the first section of the first portion of the cable, the second connector of the first section of the first portion of the cable positioned at the second end opposite to the first end, wherein the third section of the first portion of the cable further includes an eighth connector coupled to the seventh connector of the first section of the first portion of the cable.

4. The breakout cable of claim 3, wherein the second section of the first portion of the cable and the third section of the first portion of the cable are independently removable i) to retain connectivity between the switch and the first server when the second section of the first portion of the cable is removed and ii) retain connectivity between the switch and the second server when the third section of the first portion of the cable is removed.

5. The breakout cable of claim 1, wherein the volume inside of the side walls of the computing rack is the zero U space of the computing rack.

* * * * *